United States Patent
Sun et al.

(10) Patent No.: US 12,146,932 B2
(45) Date of Patent: Nov. 19, 2024

(54) MAGNETIC RESONANCE IMAGING (MRI) SYSTEM AND METHOD INTEGRATING MULTI-NUCLIDE SYNCHRONOUS IMAGING AND SPECTRAL IMAGING

(71) Applicant: Harbin Medical University, Harbin (CN)

(72) Inventors: Xilin Sun, Harbin (CN); Chunsheng Yang, Harbin (CN); Kai Wang, Harbin (CN); Yongyi Wu, Harbin (CN); Lijiao Wang, Harbin (CN); Lili Yang, Harbin (CN); Lina Wu, Harbin (CN)

(73) Assignee: HARBIN MEDICAL UNIVERSITY, Harbin (CN)

( * ) Notice: Subject to any disclaimer, the term of this patent is extended or adjusted under 35 U.S.C. 154(b) by 0 days.

(21) Appl. No.: 18/582,675

(22) Filed: Feb. 21, 2024

(65) Prior Publication Data

US 2024/0288524 A1    Aug. 29, 2024

(30) Foreign Application Priority Data

Feb. 24, 2023   (CN) .......................... 202310168015.8

(51) Int. Cl.
*G01R 33/56* (2006.01)
*G01R 33/44* (2006.01)
(Continued)

(52) U.S. Cl.
CPC ....... *G01R 33/5608* (2013.01); *G01R 33/446* (2013.01); *G01R 33/4616* (2013.01);
(Continued)

(58) Field of Classification Search
CPC .............. G01R 33/5608; G01R 33/446; G01R 33/4616; G01R 33/4828; G01R 33/4833; G01R 33/485; A61B 5/055
See application file for complete search history.

(56) References Cited

U.S. PATENT DOCUMENTS 4,769,602 A    9/1988 Vinegar et al.
6,181,134 B1   1/2001 Wald
(Continued)

FOREIGN PATENT DOCUMENTS

CN    105842641 A  *  8/2016  ......... G01R 33/5608
CN    107329100 A     11/2017
(Continued)

OTHER PUBLICATIONS

Yang, Chunsheng, et al. "A digital distributed spectrometer for dual-nuclei simultaneous MRI." 2021 IEEE International Conference on Medical Imaging Physics and Engineering (ICMIPE). IEEE, 2021. (Year: 2021).*

(Continued)

*Primary Examiner* — Rishi R Patel
(74) *Attorney, Agent, or Firm* — Bayramoglu Law Offices LLC

(57) ABSTRACT

A magnetic resonance imaging (MRI) system and method integrating multi-nuclide synchronous imaging and spectral imaging is provided. The MRI system includes a spectral imaging module, a multi-nuclide synchronous imaging module, and a spectral reconstruction and image fusion module, where the spectral imaging module is configured to acquire a spectrum of a nuclide Nuc; the multi-nuclide synchronous imaging module is configured to perform synchronous imaging of nuclides Nuc1 ... Nucn, where when n=1, Nuc1 is $^1H$; and when n>1, Nucn is a non-$^1H$ nuclide; and the spectral reconstruction and image fusion module is configured to receive the spectrum of the nuclide Nuc and images of the nuclides Nuc1 ... Nucn, and acquire spatial distribution information of compounds of the nuclide Nuc and spatial distribution information of the non-$^1H$ nuclide through fusion. The system and method can synchronously acquire (Continued)

Nuc: $^{31}P$ ; Nuc1: $^1H$ ; Nuc2: $^{19}F$; Nuc3: $^{23}Na$

MR signals of different nuclides, and reconstruct and fuse non-$^1$H nuclide images.

13 Claims, 2 Drawing Sheets

(51) Int. Cl.
  *G01R 33/46* (2006.01)
  *G01R 33/48* (2006.01)
  *G01R 33/483* (2006.01)
  *G01R 33/485* (2006.01)
(52) U.S. Cl.
  CPC ..... *G01R 33/4828* (2013.01); *G01R 33/4833* (2013.01); *G01R 33/485* (2013.01)

(56) References Cited

U.S. PATENT DOCUMENTS

| | | |
|---|---|---|
| 2007/0248997 A1 | 10/2007 | Briand |
| 2010/0256477 A1 | 10/2010 | Harvey et al. |
| 2015/0362571 A1* | 12/2015 | Le Fur ................. G01R 33/465 324/309 |

FOREIGN PATENT DOCUMENTS

| | | | |
|---|---|---|---|
| CN | 113945878 A | | 1/2022 |
| CN | 113967005 A | * | 1/2022 |

OTHER PUBLICATIONS

English translation of CN 105842641 A provided by PE2E Search (Year: 2024).*
English translation of CN 113967005 A provided by PE2E Search (Year: 2024).*
Wang Chu-Nan, et al., Advances in Multi-core 19F Magnetic Resonance Imaging, Progress in Modern Biomedicine, 2019, pp. 993-995,964, vol. 19 No. 5.
Feng Du, et al., Numerical Simulation and Evaluation of a Four-Channel-by-Four-Channel Double-Nuclear RF Coil for 1H MRI and 31P MRSI at 7 T, IEEE Transactions on Magnetics, 2018, pp. 1-5.

* cited by examiner

MAGNETIC RESONANCE IMAGING (MRI) SYSTEM AND METHOD INTEGRATING MULTI-NUCLIDE SYNCHRONOUS IMAGING AND SPECTRAL IMAGING

CROSS REFERENCE TO THE RELATED APPLICATIONS

This application is based upon and claims priority to Chinese Patent Application No. 202310168015.8, filed on Feb. 24, 2023, the entire contents of which are incorporated herein by reference.

TECHNICAL FIELD

The present disclosure relates to the technical field of magnetic resonance imaging (MRI), and in particular to an MRI system and method integrating multi-nuclide synchronous imaging and spectral imaging.

BACKGROUND

Magnetic resonance imaging (MRI) has been widely used in preclinical research and medical diagnosis and treatment. Traditional MRI focuses on proton ($^1H$) imaging and can provide functional and morphological information. Endogenous phosphorus ($^{31}P$) and sodium ($^{23}Na$) in living organisms are also MR sensitive nuclides that provide information that cannot be acquired solely by $^1H$ imaging. Fluorine ($^{19}F$) has no background signal in living organisms, but has a high gyromagnetic ratio and a wide range of chemical shift distribution in its compounds, which is helpful for imaging through chemical shift selective excitation technology. Therefore, $^{19}F$ probes are often used as targeting reagents, tracers, and drug carriers for in-vivo studies.

Phosphorus compounds participate in energy metabolism of living organisms. During the occurrence and development of tumors, the proportions of phosphorus compounds dynamically change with the occurrence and development of various molecular events. There are various types of phosphorus compounds, and the relative changes in their content can provide rich physiological information. However, due to the wide chemical shift distribution and close distance, it is hard to selectively excite individual compound and directly perform phosphorus imaging. Phosphorus spectrum acquisition from the target area is a widely used in-vivo analysis technique. Widely present in living organisms, $^{23}Na$ participates in physiological activities, and is closely related to numerous molecular events such as tumor energy metabolism, proliferation, invasion, and pH regulation. The concentration gradient of intracellular and extracellular $^{23}Na$ plays an important role in maintaining the structure and function of cells. A $^{23}Na$ MRI can achieve non-invasive in-vivo detection of the concentration and distribution of $^{23}Na$ in tissues, providing a window and opportunity for direct research on tissue vitality. As an endogenous nuclide ranking second in the intensity of MR signals, $^{23}Na$ has been widely used in the study of physiological activities and metabolic processes of living organisms. However, phosphorus compounds, $^{23}Na$, and exogenous $^{19}F$. probes are locally enriched and discontinuously distributed in living organisms, making it hard to acquire their spatial distribution information. Therefore, it is necessary to use $^1H$ images for spatial localization, which means that non-$^1H$ imaging usually needs to be combined with $^1H$ MRI.

Usually, non-$^1H$ imaging and $^1H$ MRI acquire two nuclides sequentially, resulting in a long scanning time. The imaging process in a long scanning time introduces artifacts due to movement. Such a data acquisition method increases a scanning time and makes the potential image registration difficult. In order to solve these problems, researchers have proposed imaging methods through dual-nuclide synchronous excitation and synchronous acquisition. Among them, most imaging methods, such as $^1H/^{19}F$ and $^1H/^{23}Na$ synchronous imaging, synchronously capture images of two nuclides. The method of synchronously performing spectral imaging and multi-nuclide MRI has not been reported yet.

Chinese patent CN202111190983.6 proposes a four-nuclide synchronous MRI and image reconstruction method, namely a method for synchronous imaging of a four-nuclide structure, which is suitable for situations where all the four nuclides present single peaks in the imaging object. The method cannot image nuclides with multiple spectral peaks in living organisms or samples, such as phosphorus in living organisms, and therefore cannot acquire spatial distribution maps of various phosphorus compounds.

SUMMARY

In response to the needs of preclinical research and clinical applications and the above-mentioned problems in the prior art, the present disclosure proposes an MRI system and method integrating multi-nuclide synchronous imaging and spectral imaging. The MRI system includes a spectral imaging module, a multi-nuclide synchronous imaging module, and a spectral reconstruction and image fusion module, and is configured to acquire spatial distribution information of different compounds and nuclides.

The present disclosure is implemented by the following technical solutions. An MRI system integrating multi-nuclide synchronous imaging and spectral imaging includes a spectral imaging module, a multi-nuclide synchronous imaging module, and a spectral reconstruction and image fusion module, where the spectral imaging module is configured to acquire a spectrum of a nuclide Nuc;

the multi-nuclide synchronous imaging module is configured to perform synchronous imaging of nuclides Nuc1 . . . Nucn, where n is an integer, and n≥1; when n=1, Nuc1 is $^1H$; and when n≥1, Nucn is a non-$^1H$ nuclide; and the spectral reconstruction and image fusion module is configured to receive the spectrum of the nuclide Nuc and images of the nuclides Nuc1 . . . Nucn, and acquire spatial distribution information of compounds of the nuclide Nuc and spatial distribution information of the non-$^1H$ nuclide through fusion.

An MRI method integrating multi-nuclide synchronous imaging and spectral imaging includes the following steps:

step 1: spectral imaging: selectively exciting a slice of a nuclide Nuc; distinguishing voxels within the slice through phase encoding of two dimensions; and acquiring a free induction decay (FID) signal;

step 2: multi-nuclide synchronous imaging: selectively exciting slices of nuclides Nuc1 . . . Nucn through different RF pulses; distinguishing voxels within each of the slices through phase encoding and frequency encoding; and acquiring echo signals ECHO1 . . . ECHOn while performing frequency encoding, where when n=1, Nuc1 is $^1H$; and when n>1, Nucn is a non-$^1H$ nuclide; and step 3: spectral reconstruction and image fusion: reconstructing a spectrum and target compound images of the nuclide Nuc; reconstructing an image of the nuclide Nucn; interpolating multiple target compound images of the nuclide Nuc in an image domain to a same size as a $^1$H image; integrating the target compound images of the nuclide Nuc and a non-$^1$H nuclide image into the $^1$H image; and acquiring spatial distribution information of compounds of the nuclide Nuc and spatial distribution information of a non-$^1$H nuclide.

The MRI method of the present disclosure achieves chemical shift imaging through spectral imaging, and achieves synchronous imaging of different nuclides, including protons ($^1$H), through multi-nuclide synchronous imaging. In the spectral reconstruction and image fusion process, the present disclosure first reconstructs the spectrum of each voxel of the nuclide Nuc, and then assigns the spectral peaks in the spectrum to the target compound. The present disclosure performs peak integration to acquire the content of the target compound, labels it as the pixel intensity corresponding to the voxel, and reconstructs images of multiple target compounds. Finally, the present disclosure integrates the images of the compounds and non-$^1$H nuclide images into the $^1$H image, and acquires the spatial distribution information of different compounds and nuclides.

Further, in step 1, the spectral imaging includes:
1.1: combining an RF pulse p1 with a slice selection gradient g1 and a slice selection refocusing gradient g2 applied to a slice selection gradient channel Gs, and selectively exciting the nuclide Nuc for spectral imaging; and adjusting a slice thickness of the nuclide Nuc by adjusting an intensity of the slice selection gradient g1 through a parameter ap1, where the nuclide Nuc is a non-$^1$H nuclide different from Nucn;
1.2: performing phase encoding through gradient channels Gp and Gr of two spatial dimensions orthogonal to a direction of the slice selection gradient;
labeling phase encoding gradients as g3 and g4, respectively, where g3 is applied to the gradient channel Gp, and g4 is applied to the gradient channel Gr; and adjusting a resolution within the slice of the nuclide Nuc by adjusting intensities of the phase encoding gradients g3 and g4 respectively through parameters ap2 and ap3;
1.3: acquiring the FID signal of the nuclide Nuc; and
1.4: applying phase encoding gradients g5 and g6 to the gradient channels Gp and Gr respectively to refocus phase dispersion effects of the phase encoding gradients g3 and g4.

Further, in step 2, the multi-nuclide synchronous imaging includes:
2.1: combining RF pulses p2 . . . pn with a slice selection gradient g7 and a slice selection refocusing gradient g8 applied to the slice selection gradient channel Gs, and selectively exciting the nuclides Nuc1 . . . Nucn for imaging, where n denotes an n-th nuclide, and n is an integer, and n≥1;
2.2: performing phase encoding and frequency encoding respectively through gradient channels Gp and Gr of two spatial dimensions orthogonal to a direction of the slice selection gradient; and
applying a phase encoding gradient g9 to the gradient channel Gp and a frequency encoding preparation gradient g10 to the gradient channel Gr; and applying a frequency encoding gradient g11 to the gradient channel Gr while synchronously acquiring the echo signals ECHO1 . . . ECHOn of the nuclides, where ECHO1 . . . ECHOn sampling time windows are center-aligned; and 2.3: applying a phase encoding gradient g12 to the gradient channel Gp to refocus a phase dispersion effect of the phase encoding gradient g9.

Further, in step 3, the reconstructing a spectrum and target compound images of the nuclide Nuc specifically includes:
performing zero-filling on the FID signal of the nuclide Nuc, performing two-dimensional Fourier transform on the two spatial dimensions, and performing Fourier transform on a time dimension of the FID signal to acquire a spectrum of compounds of the nuclide Nuc in each voxel; and
processing the spectrum, assigning peaks in the processed spectrum to different target compounds, integrating the peaks to acquire contents of the target compounds, and labeling a pixel intensity corresponding to the voxel, thereby reconstructing the target compound images.

Further, in step 3, the reconstructing an image of the nuclide Nucn specifically includes: filling the echo signals ECHO1 . . . ECHOn into k-spaces of the nuclides Nuc1 . . . Nucn, respectively; zero-filling each of the k-spaces according to a ratio of a gyromagnetic ratio of the nuclide to a gyromagnetic ratio of $^1$H, thereby ensuring that each nuclide and $^1$H maintain a same imaging field of view; and performing two-dimensional Fourier transform to acquire the image of the nuclide Nucn.

Further, step 1.2 further includes: simultaneously applying and center-aligning the phase encoding gradients g3, g4, and the slice selection refocusing gradient g2.

Further, step 2.1 further includes: center-aligning the RF pulses p2 . . . pn and the slice selection gradient g7; and adjusting slice thicknesses of different nuclides through different pulse shapes and pulse widths.

Further, step 2.2 further includes: simultaneously applying and center-aligning the slice selection refocusing gradient g8, the phase encoding gradient g9, and the frequency encoding preparation gradient g10.

Further, the MRI method further includes: completing the spectral imaging in step 1 and the multi-nuclide synchronous imaging in step 2 within a same repetition time.

Further, the MRI method further includes: performing, in terms of timing, the multi-nuclide synchronous imaging in step 2 after the spectral imaging in step 1.

The present disclosure has following beneficial effects:
1. The present disclosure can synchronously acquire the MR signals of different nuclides, synchronously acquire the imaging signals of multiple nuclides while waiting for the longitudinal magnetization relaxation of the nuclide Nuc, and reconstruct and fuse the compound distribution image of the nuclide Nuc and the non-proton image. The present disclosure improves the sampling time efficiency and shortens the time for multi-nuclide synchronous imaging.
2. The present disclosure acquires the spectral signal of the nuclide Nuc and the multi-nuclide imaging signals within the same repetition time (TR), ensuring accurate registration of images acquired from different nuclides in time and space.
3. The present disclosure provides adjustable parameters for the spectral information acquisition slice selection gradient of the nuclide Nuc and the phase encoding gradients of the two dimensions within the slice, facilitating the adjustment of the voxel size of the nuclide Nuc, thereby balancing signal-to-noise ratio (SNR) and resolution.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description show merely some embodiments of the present disclosure, and those skilled in the art may still derive other drawings from these drawings without creative efforts.

DETAILED DESCRIPTION OF THE EMBODIMENTS

The technical solutions of the embodiments of the present disclosure are clearly and completely described below with reference to the drawings in the embodiments of the present disclosure. Apparently, the described embodiments are merely a part rather than all of the embodiments of the present disclosure. All other embodiments obtained by those of ordinary skill in the art based on the embodiments of the present disclosure without creative efforts should fall within the protection scope of the present disclosure.

An MRI system integrating multi-nuclide synchronous imaging and spectral imaging includes a spectral imaging module, a multi-nuclide synchronous imaging module, and a spectral reconstruction and image fusion module. The spectral imaging module is configured to acquire a spectrum of a nuclide Nuc. The multi-nuclide synchronous imaging module is configured to perform synchronous imaging of nuclides Nuc1 . . . Nucn, where n is an integer, and n≥1; when n=1, Nuc1 is $^{1}$H; and when n>1, Nucn is a non-$^{1}$H nuclide. The spectral reconstruction and image fusion module is configured to receive the spectrum of the nuclide Nuc and images of the nuclides Nuc1 . . . Nucn, and acquire spatial distribution information of compounds of the nuclide Nuc and spatial distribution information of the non-$^{1}$H nuclide through fusion The present disclosure is described below with the nuclide Nuc being $^{31}$P and Nuc1, Nuc2 . . . Nucn being $^{1}$H-$^{19}$F-$^{23}$Na, respectively.

Figure 1:
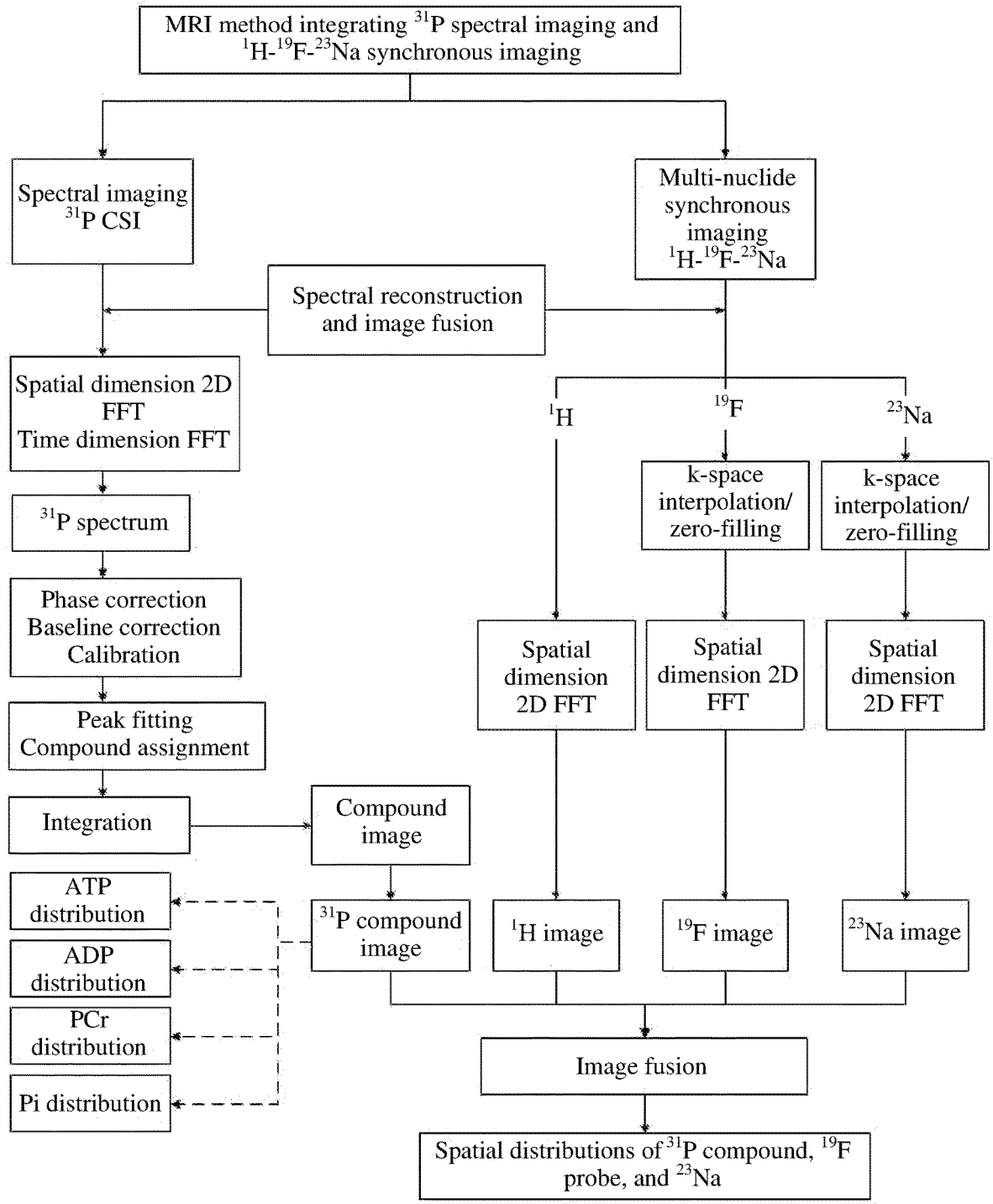
FIG. 1 shows an overall solution for $^{31}$P spectral imaging and $^{1}$H-$^{19}$F-$^{23}$Na synchronous imaging.

FIG. 1 shows an overall solution of $^{31}$P spectral imaging and $^{1}$H-$^{19}$F-$^{23}$Na synchronous MRI, which includes $^{31}$P spectral imaging, $^{1}$H-$^{19}$F-$^{23}$Na synchronous imaging, and spectral reconstruction and image fusion. $^{31}$P spectral imaging and $^{1}$H-$^{19}$F-$^{23}$Na synchronous imaging are completed within a same repetition time. $^{31}$P spectral imaging achieves chemical shift imaging (CSI), and $^{1}$H-$^{19}$F-$^{23}$Na synchronous imaging achieves multi-nuclide synchronous imaging. During spectral reconstruction and image fusion, a $^{31}$P spectrum of each voxel is first reconstructed and processed. Then, peaks in the spectrum are assigned to target compounds such as adenosine triphosphate (ATP), adenosine diphosphate (ADP), creatine phosphate (PCr), and inorganic phosphorus (Pi). The peaks are integrated to acquire the contents of the target compounds, which are converted into corresponding pixel intensities to reconstruct images of the target phosphorus compounds ATP, ADP, PCr, and Pi. The compound images and non-proton images are fused into a proton image to acquire spatial distribution information of different $^{31}$P compounds as well as $^{19}$F and $^{23}$Na.

Figure 2:
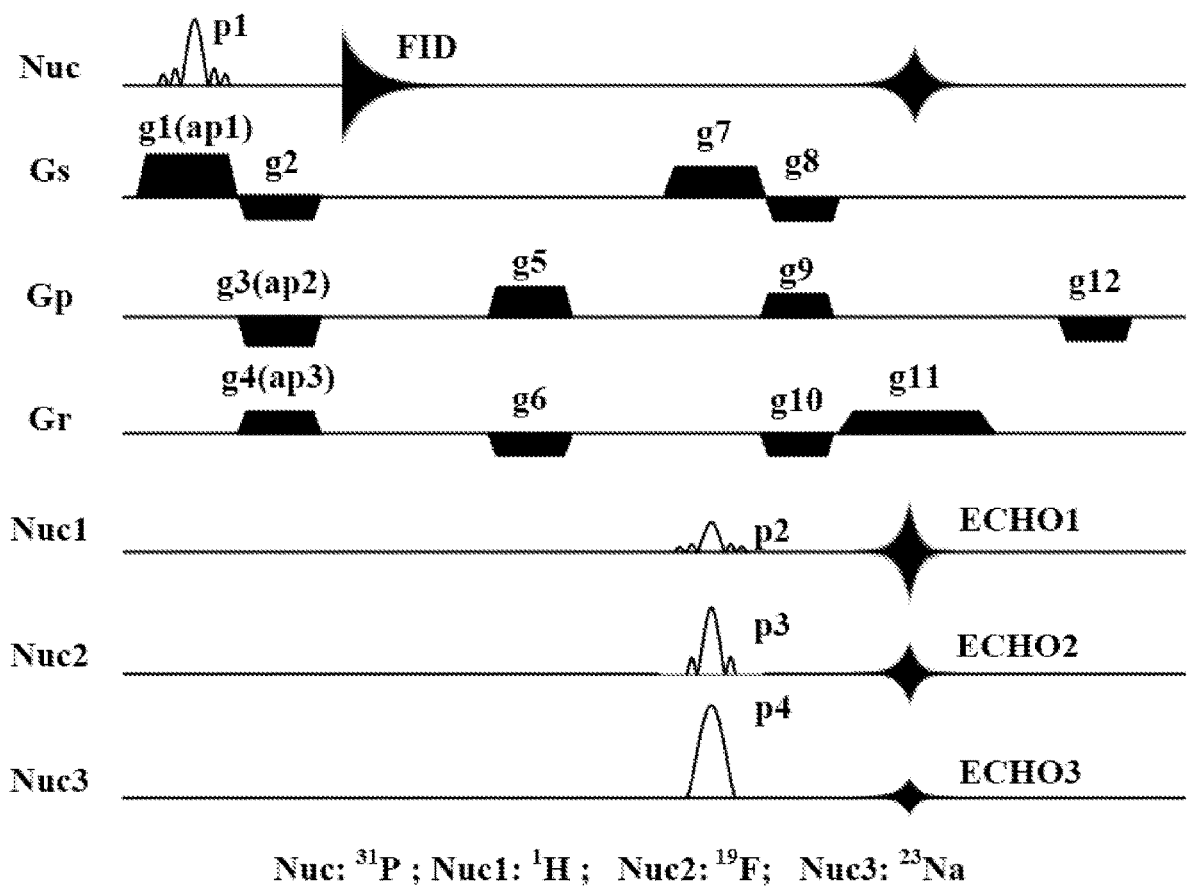
FIG. 2 is a pulse sequence diagram of $^{31}$P spectral imaging and $^{1}$H-$^{19}$F-$^{23}$Na synchronous imaging, where the diagram shows an MRI pulse sequence timing diagram for one scanning period (TR), with a horizontal axis representing a time axis.

Specifically:

The pulse sequence shown in FIG. 2 is loaded in the MRI system that supports four RF channels for transmission and reception. The four RF channels respectively correspond to the four nuclides $^{31}$P, $^{1}$H, $^{19}$F, and $^{23}$Na, and are labeled as $^{31}$P channel, $^{1}$H channel, $^{19}$F channel, and $^{23}$Na channel, respectively. The encoding gradients in three directions in space are labeled as Gs, Gp, and Gr.

As shown in FIG. 2, an MRI method integrating $^{31}$P spectral imaging and $^{1}$H-$^{19}$F-$^{23}$Na synchronous imaging includes the following steps.

1. $^{31}$P spectral imaging 1.1. RF pulse p1 of the $^{31}$P channel is combined with slice selection gradient g1 and slice selection refocusing gradient g2 applied to slice selection gradient channel Gs to selectively excite $^{31}$P for spectral imaging. An intensity of the slice selection gradient g1 is adjusted through parameter ap1, thereby adjusting a slice thickness of the $^{31}$P. As shown in FIG. 2, the RF pulse selected for p1 is a SINC pulse with 5 side-lobes.

1.2. Phase encoding is performed through the gradient channels Gp and Gr of two spatial dimensions orthogonal to the direction of the slice selection gradient. The phase encoding gradients are labeled as g3 and g4, respectively, where g3 is applied to the gradient channel Gp, and g4 is applied to the gradient channel Gr. Intensities of the phase encoding gradient g3 and g4 are adjusted respectively through parameters ap2 and ap3, thereby adjusting a resolution within the slice of 31P. The phase encoding gradients g3, g4, and the slice selection refocusing gradient g2 are simultaneously applied and center-aligned.

1.3. The FID signal of $^{31}$P is acquired.

1.4. After the FID acquisition of $^{31}$P is completed, phase encoding gradients g5 and g6 are applied to the gradient channels Gp and Gr respectively to refocus phase dispersion effects of the phase encoding gradients g3 and g4, where g5 and g3 have a same area and are applied to opposite directions; and g6 and g4 have a same area and are applied to opposite directions.

2. After the $^{31}$P spectral imaging, the $^{1}$H-$^{19}$F-$^{23}$Na synchronous imaging is performed. The $^{1}$H-$^{19}$F-$^{23}$Na synchronous imaging includes the following steps.

2.1. RF pulses p2, p3, and p4 are applied to $^{1}$H, $^{19}$F, and $^{23}$Na channels, respectively. The three RF pulses are combined with slice selection gradient g7 and slice selection refocusing gradient g8 applied to the slice selection gradient channel Gs to selectively excite the nuclides $^{1}$H $^{19}$F, and $^{23}$Na for imaging. The RF pulses p2, p3, and p4 are center-aligned with the slice selection gradient g7. As shown in FIG. 2, the $^{1}$H channel uses a SINC pulse with 5 side-lobes; the $^{19}$F channel a uses Hermite pulse; and the $^{23}$Na channel uses a Gaussian pulse.

2.2. Phase encoding and frequency encoding are performed respectively through gradient channels Gp and Gr of two spatial dimensions orthogonal to a direction of the slice selection gradient.

A phase encoding gradient g9 is applied to the gradient channel Gp, a frequency encoding preparation gradient g10 is applied to the gradient channel Gr, and a frequency encoding gradient g11 is applied to the gradient channel Gr. The echo signals ECHO1, ECHO2, and ECHO3 of $^{1}$H, $^{19}$F, and $^{23}$Na are synchronously acquired, where ECHO1, ECHO2, and ECHO3 sampling time windows are center-aligned; and the slice selection refocusing gradient g8, the phase encoding gradient g9, and the frequency encoding preparation gradient g10 are simultaneously applied and center-aligned.

2.3. A phase encoding gradient g12 is applied to an opposite direction to the gradient channel Gp to refocus a phase dispersion effect of the phase encoding gradient g9, where g12 and g9 have a same area.

3. As shown in FIG. 1, $^{31}$P spectral reconstruction and image fusion includes the following steps:

3.1 Reconstruction of $^{31}$P spectra and compound images

Zero-filling is performed on the $^{31}$P FID signal, two-dimensional Fourier transform is performed on the two spatial dimensions, and Fourier transform is performed on the time dimension of the FID signal to acquire a $^{31}$P compound spectrum in each voxel. The spectrum is subjected to phase correction, baseline correction, calibration, and peak fitting. The peaks in the spectrum are assigned to different target compounds, such as ATP, ADP, PCr, and Pi. Further, the assigned peaks are integrated to acquire the contents of the target compounds. The pixel intensity corresponding to the voxel is labeled to reconstruct images of the target compounds such as ATP, ADP, PCr, and Pi.

3.2. Reconstruction of $^1$H, $^{19}$F, and $^{23}$Na images

Echo signals ECHO1, ECHO2, and ECHO3 of $^1$H, $^{19}$F, and $^{23}$Na are filled in the k-spaces of $^1$H, $^{19}$F, and $^{23}$Na, respectively. According to ratios of gyromagnetic ratios of $^{19}$F and $^{23}$Na to the gyromagnetic ratio of $^1$H, the k-spaces are zero-filled to ensure that $^{19}$F and $^{23}$Na remain the same imaging field of view as $^1$H. Then two-dimensional Fourier transform is performed to acquire images of $^1$H, $^{19}$F, and $^{23}$Na.

3.3. The images of the $^{31}$P compounds are interpolated in an image domain to the same size as the $^1$H image, and the $^{31}$P compound images are fused with the $^{19}$F $^{23}$Na and images into the $^1$H image to acquire the spatial distribution information of different compounds (ATP, ADP, PCr, and Pi) and exogenous $^{19}$F and $^{23}$Na probes.

The above described are merely preferred embodiments of the present disclosure, and not intended to limit the present disclosure. Any modifications, equivalent replacements and improvements made within the spirit and principle of the present disclosure should all fall within the scope of protection of the present disclosure.

What is claimed is:

1. A magnetic resonance imaging (MRI) system integrating multi-nuclide synchronous imaging and spectral imaging, comprising a spectral imaging module, a multi-nuclide synchronous imaging module, and a spectral reconstruction and image fusion module, wherein
the spectral imaging module is configured to acquire a spectrum of a nuclide Nuc;
the multi-nuclide synchronous imaging module is configured to perform synchronous imaging of nuclides Nuc1 . . . Nucn, wherein n is an integer, and n>1; Nuc1 is $^1$H; Nucn is a non-$^1$H nuclide; and Nuc and Nuc1 . . . Nucn are different nuclides;
the spectral reconstruction and image fusion module is configured to receive the spectrum of the nuclide Nuc and images of the nuclides Nuc1 . . . Nucn, and acquire spatial distribution information of compounds of the nuclide Nuc and spatial distribution information of the non-$^1$H nuclide through fusion; and the spectral reconstruction and image fusion module is configured to reconstruct the spectrum and target compound images of the nuclide Nuc, reconstruct the images of the nuclides Nuc1 . . . Nucn, interpolate each of the target compound images of the nuclide Nuc in an image domain to a same size as a $^1$H image, integrate the target compound images of the nuclide Nuc and a non-$^1$H nuclide image into the $^1$H image to implement the fusion, and acquire spatial distribution information of target compounds of the nuclide Nuc and spatial distribution information of the non-$^1$H nuclide through the fusion; and
the spectral imaging performed by the spectral imaging module and the multi-nuclide synchronous imaging performed by the multi-nuclide synchronous imaging module are completed within a same repetition time such that the multi-nuclide synchronous imaging performed by the multi-nuclide synchronous imaging module is performed by applying different radio frequency (RF) pulses to the nuclides Nuc1 . . . Nucn and synchronously acquiring, during longitudinal magnetization relaxation of the nuclide Nuc, echo signals ECHO1 . . . ECHOn from the nuclides Nuc1 . . . Nucn in response to the RF pulses; and in terms of timing, the multi-nuclide synchronous imaging is performed after the spectral imaging.

2. An MRI method integrating multi-nuclide synchronous imaging and spectral imaging, comprising the following steps:
step 1: spectral imaging: selectively exciting a slice of a nuclide Nuc; distinguishing voxels within the slice through phase encoding of two dimensions; and acquiring a free induction decay (FID) signal;
step 2: multi-nuclide synchronous imaging: selectively exciting slices of nuclides Nuc1 . . . Nucn through different radio frequency (RF) pulses; distinguishing voxels within each of the slices through phase encoding and frequency encoding; and acquiring, during longitudinal magnetization relaxation of the nuclide Nuc, echo signals ECHO1 . . . ECHOn synchronously while performing frequency encoding, wherein n denotes an n-th nuclide; n is an integer, and n>1; Nuc1 is $^1$H; and Nucn is a non-$^1$H nuclide, wherein Nuc and Nuc1 . . . Nucn are different nuclides; and
step 3: reconstructing a spectrum and target compound images of the nuclide Nuc; reconstructing images of the nuclides Nuc1 . . . Nucn; interpolating each of the target compound images of the nuclide Nuc in an image domain to a same size as a $^1$H image; integrating the target compound images of the nuclide Nuc and a non-$^1$H nuclide image into the $^1$H image; and acquiring spatial distribution information of target compounds of the nuclide Nuc and spatial distribution information of the non-$^1$H nuclide;
wherein, the spectral imaging in step 1 and the multi-nuclide synchronous imaging in step 2 are completed within a same repetition time; and in terms of timing, the multi-nuclide synchronous imaging in step 2 is performed after the spectral imaging in step 1.

3. The MRI method integrating multi-nuclide synchronous imaging and spectral imaging according to claim 2, wherein in step 1, the spectral imaging comprises:
1.1: combining an RF pulse p1 with a slice selection gradient g1 and a slice selection refocusing gradient g2 applied to a slice selection gradient channel Gs, and selectively exciting the nuclide Nuc for spectral imaging; and adjusting a slice thickness of the nuclide Nuc by adjusting an intensity of the slice selection gradient g1 through a parameter ap1, wherein the nuclide Nuc is a non-$^1$H nuclide different from Nucn;
1.2: performing phase encoding through gradient channels Gp and Gr of two spatial dimensions orthogonal to a direction of the slice selection gradient;
labeling phase encoding gradients as g3 and g4, respectively, wherein g3 is applied to the gradient channel Gp, and g4 is applied to the gradient channel Gr; and adjusting a resolution within the slice of the nuclide Nuc by adjusting intensities of the phase encoding gradients g3 and g4 respectively through parameters ap2 and ap3;

1.3: acquiring the FID signal of the nuclide Nuc; and 1.4: applying phase encoding gradients g5 and g6 to the gradient channels Gp and Gr respectively to refocus phase dispersion effects of the phase encoding gradients g3 and g4.

4. The MRI method integrating multi-nuclide synchronous imaging and spectral imaging according to claim 2, wherein in step 2, the multi-nuclide synchronous imaging comprises:

2.1: combining RF pulses p2 . . . pn+1 with a slice selection gradient g7 and a slice selection refocusing gradient g8 applied to the slice selection gradient channel Gs, and selectively exciting the nuclides Nuc1 . . . Nucn for imaging;

2.2: performing phase encoding and frequency encoding respectively through gradient channels Gp and Gr of two spatial dimensions orthogonal to a direction of the slice selection gradient; and applying a phase encoding gradient 99 to the gradient channel Gp and a frequency encoding preparation gradient g10 to the gradient channel Gr; and applying a frequency encoding gradient g11 to the gradient channel Gr while synchronously acquiring the echo signals ECHO1 . . . ECHOn of the nuclides, wherein ECHO1 . . . ECHOn sampling time windows are center-aligned; and 2.3: applying a phase encoding gradient g12 to the gradient channel Gp to refocus a phase dispersion effect of the phase encoding gradient g9.

5. The MRI method integrating multi-nuclide synchronous imaging and spectral imaging according to claim 3, wherein in step 3, the reconstructing the spectrum and target compound images of the nuclide Nuc comprises:

performing zero-filling on the FID signal of the nuclide Nuc, performing two-dimensional Fourier transform on the two spatial dimensions, and performing Fourier transform on a time dimension of the FID signal to acquire the spectrum, which is of compounds of the nuclide Nuc in each voxel; and processing the spectrum, assigning peaks in the processed spectrum to different target compounds, integrating the peaks to acquire contents of the target compounds, and labeling a pixel intensity corresponding to the voxel, thereby reconstructing the target compound images.

6. The MRI method integrating multi-nuclide synchronous imaging and spectral imaging according to claim 2, wherein in step 3, the reconstructing images of the nuclides Nuc1 . . . Nucn comprises: filling the echo signals ECHO1 . . . ECHOn into k-spaces of the nuclides Nuc1 . . . Nucn, respectively; zero-filling each of the k-spaces according to a ratio of a gyromagnetic ratio of the nuclide to a gyromagnetic ratio of $^1H$, thereby ensuring that each nuclide and $^1H$ maintain a same imaging field of view; and performing two-dimensional Fourier transform to acquire the images of the nuclides Nuc1 . . . Nucn.

7. The MRI method integrating multi-nuclide synchronous imaging and spectral imaging according to claim 3, wherein step 1.2 further comprises: simultaneously applying and center-aligning the phase encoding gradients g3, g4, and the slice selection refocusing gradient g2.

8. The MRI method integrating multi-nuclide synchronous imaging and spectral imaging according to claim 4, wherein step 2.1 further comprises: center-aligning the RF pulses p2 . . . pn and the slice selection gradient g7; and adjusting slice thicknesses of different nuclides through different pulse shapes and pulse widths.

9. The MRI method integrating multi-nuclide synchronous imaging and spectral imaging according to claim 4, wherein step 2.2 further comprises: simultaneously applying and center-aligning the slice selection refocusing gradient g8, the phase encoding gradient g9, and the frequency encoding preparation gradient g10.

10. The MRI method integrating multi-nuclide synchronous imaging and spectral imaging according to claim 3, wherein in step 3, the reconstructing the spectrum and target compound images of the 8nuclide Nuc comprises:

performing zero-filling on the FID signal of the nuclide Nuc, performing two-dimensional Fourier transform on the two spatial dimensions, and performing Fourier transform on a time dimension of the FID signal to acquire the spectrum, which is of compounds of the nuclide Nuc in each voxel; and processing the spectrum, assigning peaks in the processed spectrum to different target compounds, integrating the peaks to acquire contents of the target compounds, and labeling a pixel intensity corresponding to the voxel, thereby reconstructing the target compound images.

11. The MRI method integrating multi-nuclide synchronous imaging and spectral imaging according to claim 4, wherein in step 3, the reconstructing the spectrum and target compound images of the nuclide Nuc comprises:

performing zero-filling on the FID signal of the nuclide Nuc, performing two-dimensional Fourier transform on the two spatial dimensions, and performing Fourier transform on a time dimension of the FID signal to acquire the spectrum, which is of compounds of the nuclide Nuc in each voxel; and processing the spectrum, assigning peaks in the processed spectrum to different target compounds, integrating the peaks to acquire contents of the target compounds, and labeling a pixel intensity corresponding to the voxel, thereby reconstructing the target compound images.

12. The MRI method integrating multi-nuclide synchronous imaging and spectral imaging according to claim 3, wherein in step 3, the reconstructing images of the nuclides Nuc1 . . . Nucn comprises: filling the echo signals ECHO1 . . . ECHOn into k-spaces of the nuclides Nuc1 . . . Nucn, respectively; zero-filling each of the k-spaces according to a ratio of a gyromagnetic ratio of the nuclide to a gyromagnetic ratio of $^1H$, thereby ensuring that each nuclide and $^1H$ maintain a same imaging field of view; and performing two-dimensional Fourier transform to acquire the images of the nuclides Nuc1 . . . Nucn.

13. The MRI method integrating multi-nuclide synchronous imaging and spectral imaging according to claim 4, wherein in step 3, the reconstructing images of the nuclides Nuc1 . . . Nucn comprises: filling the echo signals ECHO1 . . . ECHOn into k-spaces of the nuclides Nuc1 . . . Nucn, respectively; zero-filling each of the k-spaces according to a ratio of a gyromagnetic ratio of the nuclide to a gyromagnetic ratio of $^1H$, thereby ensuring that each nuclide and $^1H$ maintain a same imaging field of view; and performing two-dimensional Fourier transform to acquire the images of the nuclides Nuc1 . . . Nucn.

* * * * *